United States Patent [19]
Matsukawa et al.

[11] Patent Number: 5,515,327
[45] Date of Patent: May 7, 1996

[54] NONVOLATILE SEMICONDUCTOR MEMORY DEVICE HAVING A SMALL NUMBER OF INTERNAL BOOSTING CIRCUITS

[75] Inventors: Naohiro Matsukawa, Kamakura; Ryouhei Kirisawa, Kitakami; Riichiro Shirota, Kawasaki, all of Japan

[73] Assignee: Kabushiki Kaisha Toshiba, Kawasaki, Japan

[21] Appl. No.: 359,648

[22] Filed: Dec. 20, 1994

[30] Foreign Application Priority Data

Dec. 21, 1993 [JP] Japan .................................. 5-320712

[51] Int. Cl.$^6$ .................................................. G11C 13/00
[52] U.S. Cl. .................................. 365/203; 365/185.25
[58] Field of Search ............................. 365/203, 189.01, 365/185, 185.01, 185.12, 185.11, 185.23, 185.25

[56] References Cited

U.S. PATENT DOCUMENTS 5,388,065  2/1995  Yoneda ........................ 365/185.25

FOREIGN PATENT DOCUMENTS 4-278297  of 0000  Japan.

Primary Examiner—Terrell W. Fears
Attorney, Agent, or Firm—Banner & Allegretti, Ltd.

[57] ABSTRACT

An EEPROM in which a select transistor to which any memory cell not selected is turned off to inhibit electron injections into the floating gate of the memory cell not selected. The memory cells of the EEPROM are arranged in rows and columns in a substrate. The memory cells forming each column are connected in series. The two endmost memory cells are connected to two select transistors, respectively. The bit lines are connected to a data latch/sense amplifier, which is connected to a column decoder. The column decoder controls the bit lines. A row decoder controls select gates and control gates. A voltage-boosting circuit generates a high voltage, which is applied to the substrate and the select gates to erase data in the EEPROM, and to the control gates to write data into the EEPROM. A low-voltage controller generates a low voltage, which is applied to the select gates for turning off the select transistors of the column not selected, thereby to prevent data-writing.

31 Claims, 12 Drawing Sheets

| | READ | ERASE | WRITE |
|---|---|---|---|
| BL | PRECHARGE: 5V | OPEN | WRITING "0": 0V<br>WRITING "1": 10V |
| SG1 | 5 V | 20 V | 10 V |
| CG | SELECTED: 0V<br>NOT SELECTED: 5V | 0V | SELECTED: 20 V<br>NOT SELECTED: 10 V |
| SG2 | 5 V | 20 V | 0 V |
| W | 0 V | 20V | 0 V |
| S | 0V | 20V | 0 V |

|  | READ | ERASE | WRITE |  | T1 | T2 |
|---|---|---|---|---|---|---|
| BL | 5V | OPEN | WRITING "0" | | 0V | 0V |
|  |  |  | WRITING "1" | | 5V | 5V |
| SG1 | 5V | 20V |  | | 3V | 3V |
| CG | SELECTED: 0V | 0V | SELECTED | | 5V | 20V |
|  | NOT SELECTED: 5V |  | NOT SELECTED | | 5V | 5V |
| SG2 | 5V | 20V | 0V | | | |
| W | 0V | 20V | 0V | | | |
| S | 0V | 20V | 0V | | | |

| | READ | ERASE | WRITE | T1 | T2 |
|---|---|---|---|---|---|
| BL | 5V | OPEN | WRITING "0" | 0V | 0V |
| | | | WRITING "1" | 5V | 5V |
| SG1 | 5V | 20V | | 5V | 3V |
| CG | SELECTED : 0V | 0V | SELECTED | 5V | 20V |
| | NOT SELECTED : 5V | | NOT SELECTED | 5V | 5V |
| SG2 | 5V | 20V | 0V | | |
| W | 0V | 20V | 0V | | |
| S | 0V | 20V | 0V | | |

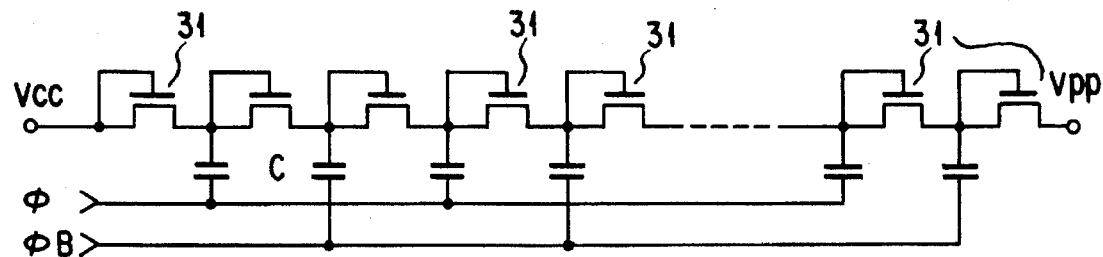
F I G. 16
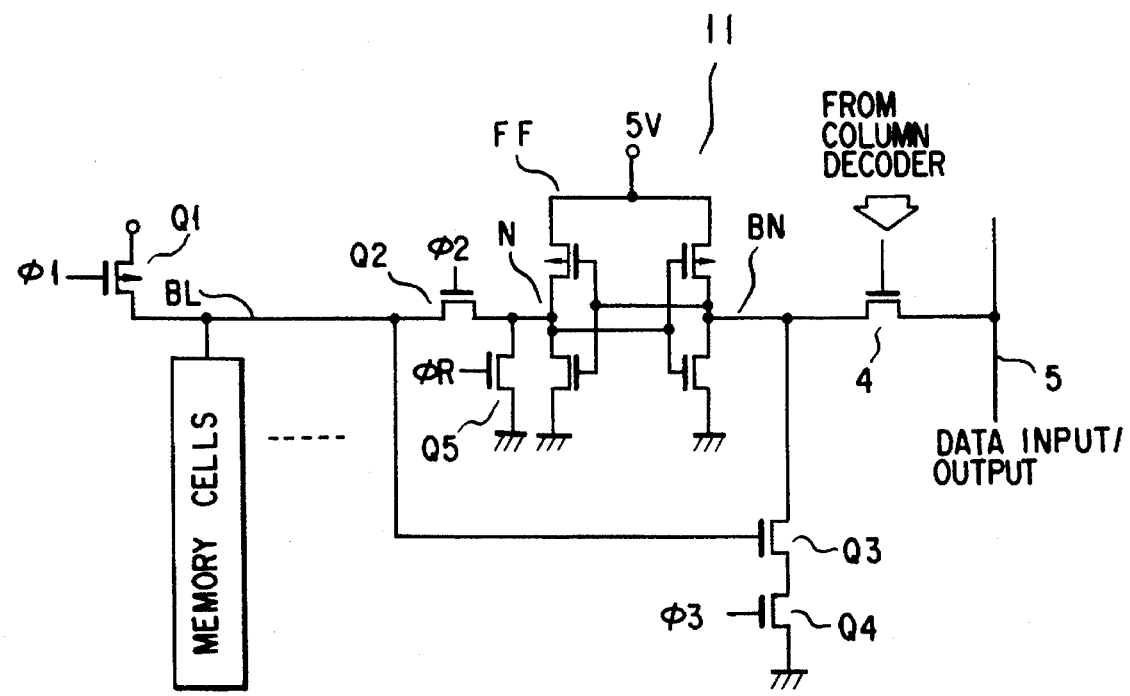
F I G. 17

|  | READ | ERASE | WRITE | | T1 | T2 |
|---|---|---|---|---|---|---|
| BL | 5V | OPEN | WRITING "0" | | 0V | 0V |
| | | | WRITING "1" | | 5V | 5V |
| SG1 | 5V | 0V | | | 5V | 5V |
| CG | SELECTED: 0V | 0V | SELECTED | | 5V | 20V |
| | NOT SELECTED: 5V | | NOT SELECTED | | 5V | 5V |
| SG2 | 5V | 0V | 0V | | | |
| W | 0V | 20V | 0V | | | |
| S | 0V | 20V | 0V | | | |

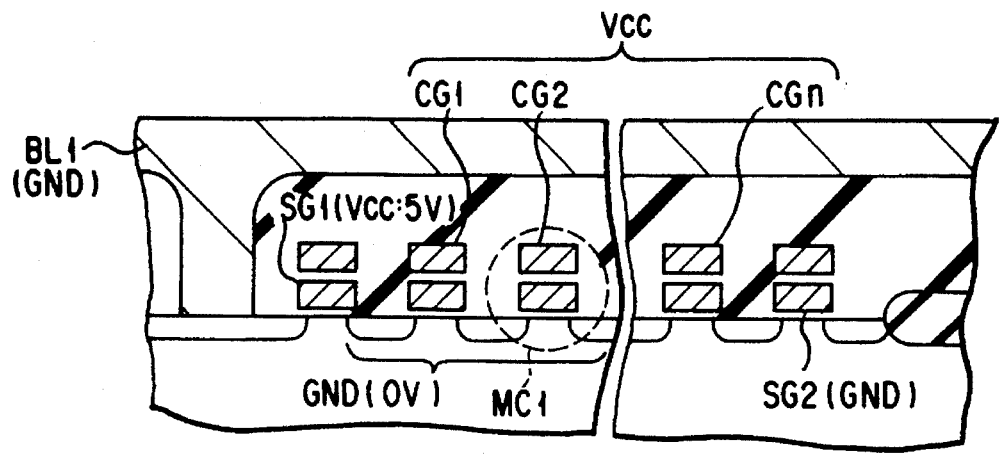
F I G. 21
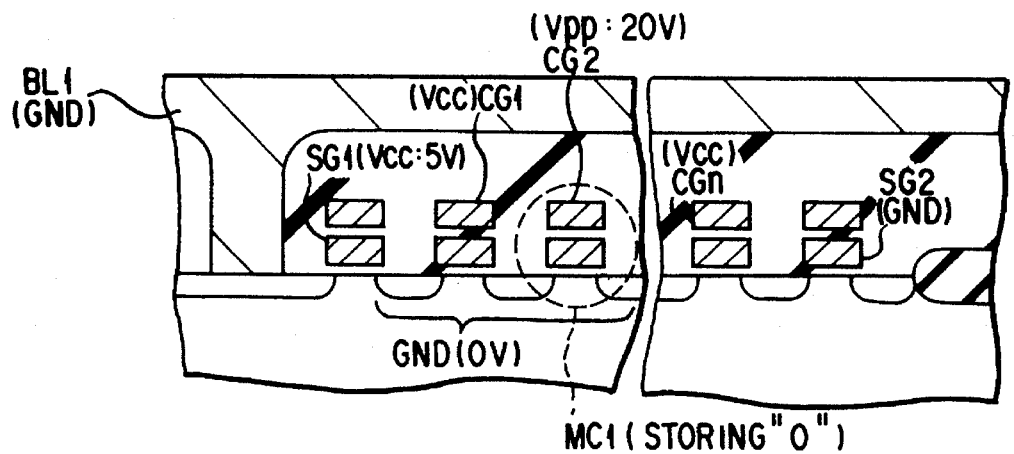
F I G. 22
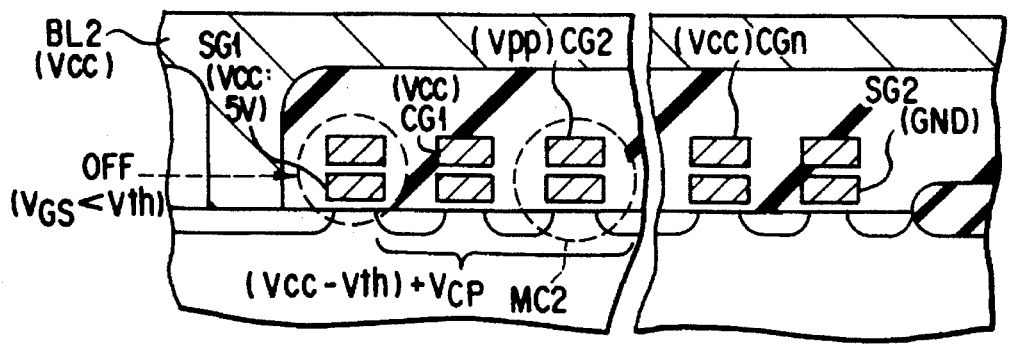
F I G. 23

NONVOLATILE SEMICONDUCTOR MEMORY DEVICE HAVING A SMALL NUMBER OF INTERNAL BOOSTING CIRCUITS

BACKGROUND OF THE INVENTION

1. Field of the Invention

The present invention relates to an electrically erasable programmable read-only memory device, and more particularly to an improved system for driving the data-writing section of the memory device.

2. Description of the Related Art

Electrically erasable programmable read-only memories (EEPROMs) of various types, each having a large storage capacity, are known. Among these is a NAND-type flash EEPROM whose memory cells occupy a very small area.

FIG. 1 is a circuit diagram showing some of the multi-layered memory cells incorporated in a conventional NAND-type flash EEPROM. These multi-layered memory cells are arranged in n rows and two columns in a substrate W. The multi-layered memory cells forming each column are connected in series and controlled by control gates CG1, CG2, ... CGn. The drain D of one endmost memory cell of each column is connected to the select gate SG1 of a select transistor which functions as a transfer transistor. The source S of the other endmost memory cell of each column is connected to the select gate SG2 of a select transistor which functions as a transfer transistor.

FIG. 2 is a table representing the data-writing voltages, data-reading voltages and data-erasing voltages which are applied at various points in the conventional NAND-type flash EEPROM. With reference to FIG. 2 it will be explained how data is erased from the NAND-type flash EEPROM, how data is written thereinto, and how data is read therefrom.

To erase data in the NAND-type flash EEPROM, an erase voltage $V_{EE}$ of 20 V is applied to the substrate W and the select gates SG1 and SG2, and the control gates CG1 to CGn are biased to 0 V. Electrons are thereby extracted from the floating gates of all memory cells. As a result, all memory cells are set into a normally-on state at a time, by a of tunnel effect of the oxide film (tunnel oxide film) formed on the substrate W. That is, every memory cell is set into a depleted state to store data "1."

To write data into the NAND-type flash EEPROM, a write voltage Vpp of 20 V is applied to the control gate of any memory cell selected, and a voltage Vm of 10 V, lower than Vpp and higher than 0 V, is applied to the control gate of any memory cell not selected. At the same time, 10 V is applied to the select gates SG1, and 0 V to the select gates SG2. Further, 0 V is applied to any bit line to which the memory cells into which to write data "0", whereas the intermediate voltage Vm (10 V) is applied to any bit line to which the memory cells in which to preserve data "1."

Therefore, an electric field is generated which is so intense that a tunnel current flows through the tunnel oxide film under the floating gate of a selected memory cell. A control gate of the selected memory cell is set at Vpp. Source, drain (connected to a bit line BL) and channel regions of the selected memory cell are set at 0 V. In other words, electrons are injected into the floating gate, too, raising the threshold voltage of the selected memory cell to a positive value. An electric field is applied to any memory cell not selected. However, this electric field is not intense enough to make a tunnel current flow through the tunnel oxide film of the unselected cell, because of the little difference between the write voltage Vpp (20 V) and the intermediate voltage Vm (10 V).

To read data from the NAND-type flash EEPROM, 0 V is applied to the control gate CG of any memory cell selected, and a read voltage $V_{RD}$ of 5 V is applied to the control gate CG of any memory cell not selected causing the unselected cell to turn on and function as a transfer gate. It is then detected whether or not a current flows through the cell from the bit line BL. The cell selected is found to store data "1" if a current flows into it, and to store data "0" if no current flows into it. A flow of a current into the cell means that the cell remains in the depleted state; no flow of a current into the cell means that the threshold voltage of the cell has risen to a positive value.

To write data into the conventional NAND-type flash EEPROM it is necessary to apply high voltage in the gate oxide film of the select transistor, i.e., the intermediate voltage Vm of 10 V. Therefore, one oxide film cannot be used as both the gate oxide film of each select transistor and the tunnel oxide film of each memory cell. That is, the gate oxide film and the tunnel oxide film need to be formed separately. Consequently, the memory cells occupy a large area, the gate oxide film and the tunnel oxide film can hardly be made to have the same or similar quality.

Moreover, to operate the conventional NAND-type flash EEPROM, three different voltages are involved, including Vpp, Vm and a read voltage $V_{RD}$ of 5 V. MOSFETs of three different types need to be incorporated in the circuits peripheral to the memory cell array. Particularly, MOSFETs driven by the intermediate voltage Vm must be used in the column decoder, inevitably increasing the area the column decoder occupies. Further the voltage-boosting circuit 15 comprises two types of boosting units for Vpp and Vm, resulting in occupation of a great part of the conventional NAND-type flash EEPROM.

SUMMARY OF THE INVENTION

In view of the foregoing, the object of this invention is to provide a nonvolatile semiconductor memory device, into which data can be written without applying an intermediate voltage, in which two gate oxide films, need not be formed in the memory cell array, and in which no circuit peripheral to the memory cell array needs to incorporate MOSFETs driven by an intermediate voltage, and which can therefore be made small.

The object is attained by a nonvolatile semiconductor memory device which comprises:

a semiconductor substrate;

memory cell means having a source region and a drain region, both formed in a surface of the semiconductor substrate, a transistor having a charge-accumulating layer provided on the surface of the semiconductor substrate and located between the source and drain regions, and a control gate electrode provided on the charge-accumulating layer of the transistor;

a select transistor having a gate electrode and a current path, provided at an edge of the memory cell means, and having a threshold voltage;

a bit line to which the drain region of the memory cell means is connected by the current path of the select transistor;

charging means for applying, during a first data-writing period, a first voltage to the control gate electrode of the memory cell means and the bit line not selected, and a second voltage to the gate electrode of the select transistor to turn on the select transistor, thereby to charge the drain region of the memory cell means which is connected to the bit line not selected, to a third voltage which is lower than the second voltage by the threshold voltage of the select transistor;

control-gate voltage switching means for increasing voltages of the source and drain regions of the memory cell means and a voltage of a channel region provided between the source and drain regions, thereby to increase the third voltage, by virtue of capacitive coupling which occurs between the control gate electrode and the charge-accumulating layer and between the charge-accumulating layer and the source, drain and channel regions when a data-writing high voltage is applied to the control gate during a second data-writing period; and data-write prohibiting means for turning off the select transistor to cut off the current path of the memory cell means when a source-gate voltage of the select transistor falls below the threshold voltage of the select transistor due to the capacitive coupling.

When the memory device according to the invention is set in data-writing mode, the injection of electrons into any memory cell charge-accumulating layer not selected is inhibited by turning off the select transistor connected to any column of memory cells including at least one cell not selected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a diagram showing the voltage-boosting circuit used in the EEPROM of FIG. 3;

FIG. 17 is a circuit diagram of the data latch/sense amplifier incorporated in the EEPROM of FIG. 3;

FIG. 19 is a table showing the various voltages applied at various points in the EEPROM of FIG. 18 to drive the memory cells incorporated in this EEPROM;

FIGS. 20 to 23 are sectional views of some of the memory cells of the EEPROM shown in FIG. 18.

DETAILED DESCRIPTION OF THE PREFERRED EMBODIMENTS

Embodiments of the present invention will be described, with reference to the accompanying drawings.

Figure 3:
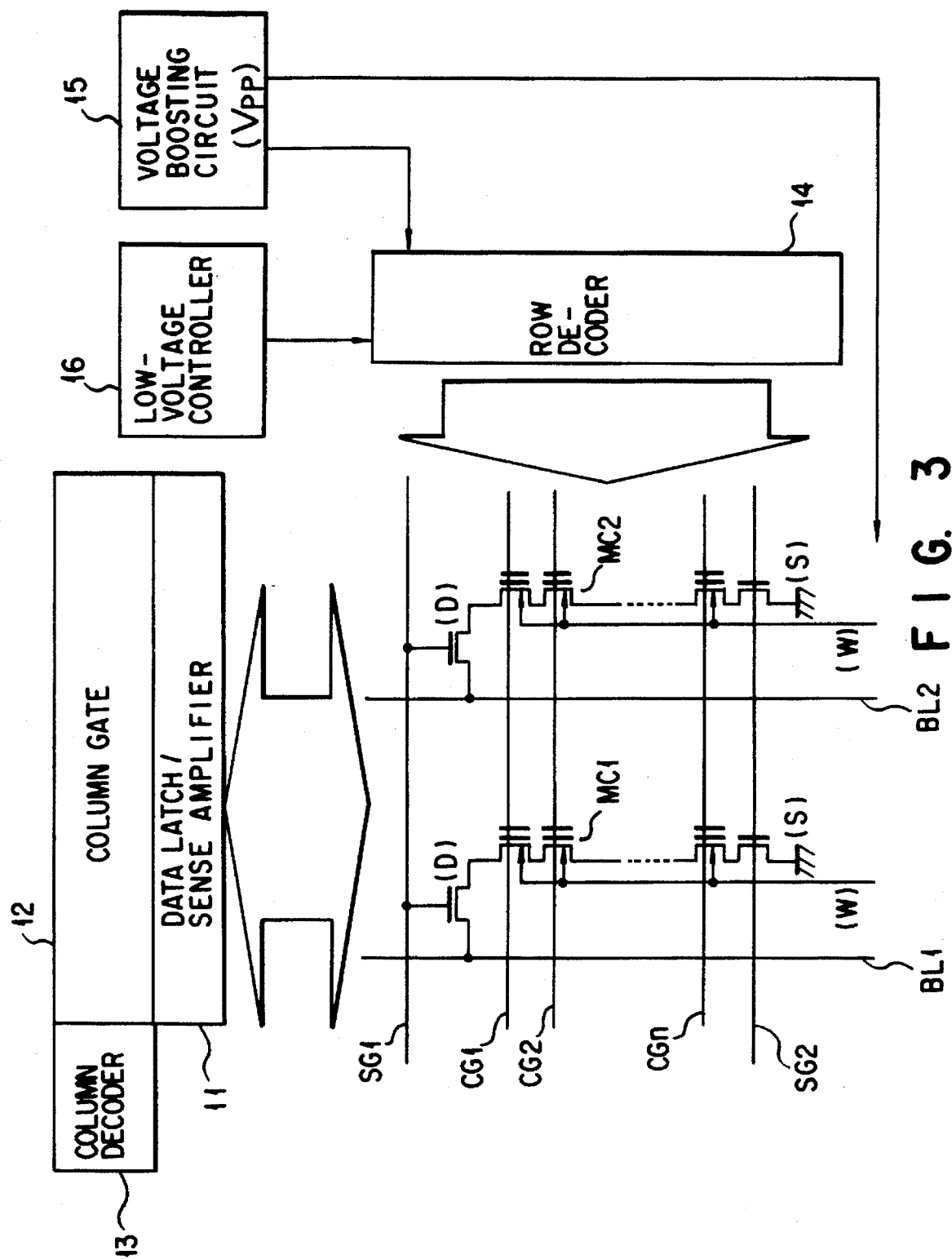
FIG. 3 is a block diagram illustrating the major components of a NAND-type flash EEPROM which is the first embodiment of the invention.

FIG. 3 is a block diagram illustrating the major components of a NAND-type flash EEPROM which is the first embodiment of the invention. Only a part of the memory cell incorporated in the NAND-type flash EEPROM is illustrated in FIG. 3.

As shown in FIG. 3, the EEPROM comprises a memory cell array, a data latch/sense amplifier 11, a column decoder 13, a column gate 12, a row decoder 14, a voltage-boosting circuit 15, and a low-voltage controller 16. The memory cell array, only a part of which is shown in FIG. 3, comprises bit lines B1 (only two, BL1 and BL2, are shown) and a plurality of multi-layer memory cells (hereinafter referred to as "memory cells"). The multi-layered memory cells shown in FIG. 3 are arranged in n rows and two columns in a substrate W. The memory cells forming each column are connected in series and controlled by control gates (i.e., word lines) CG1, CG2, ... CGn. The drain D of one endmost memory cell of each column is connected to the select gate SG1 of a select transistor which functions as a transfer transistor. The source S of the other endmost memory cell of each column is connected to the select gate SG2 of a select transistor which functions as a transfer transistor.

The bit lines BL1 and BL2 are connected to the data latch/sense amplifier 11, which in turn is connected to the column gate 12. The column gate 12 is connected to the column decoder 13. The column decoder 13 can therefore select and control the bit lines BL1 and BL2. The select transistor is connected to the bit lines BL by the data latch/sense amplifier 11 and a column decoder 13. The select gates SG1 and SG2 and the control gates CG1, CG2, ... CGn are connected to the row decoder 14. Thus, the row decoder 14 can select and control the select gates SG1 and SG2 and the control gates CG1, CG2, ... CGn.

The voltage-boosting circuit 15 is provided for generating a high voltage, which is applied to the substrate W and the select gates SG1 and SG2 to erase data in the EEPROM, and to the control gates CG1, CG2, ... CGn to write data into the EEPROM. The low-voltage controller 16 is used to generate a low voltage $V_L$, which is applied to the select gate SG1 for turning off the select transistor of the unselected bit line to prevent data-writing.

Figures 4, 5:
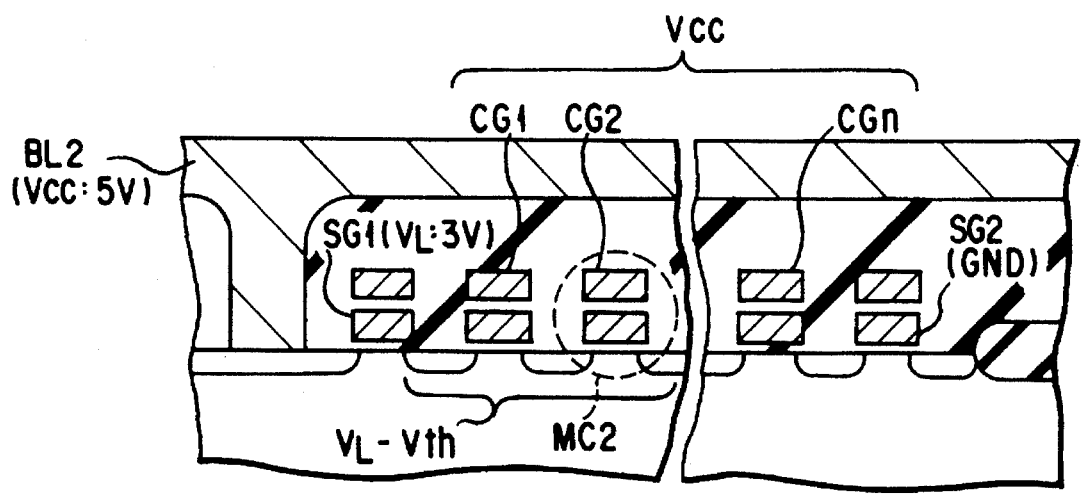
FIG. 4 is a table showing the various voltages applied at various points in the EEPROM of FIG. 3 to drive the memory cells incorporated in the EEPROM.
FIGS. 5 to 8 are sectional views of some of the memory cells of the EEPROM shown in FIG. 3.

FIG. 4 is a table which shows the data-writing voltages, data-reading voltages and data-erasing voltages which are applied at various points in the NAND-type flash EEPROM illustrated in FIG. 3. Vcc is the power-supply voltage of, for example, 5 V. Vpp is a high voltage of, for example, 20 V and used for erasing and writing data. The low voltage $V_L$ is, for example, 3 V. GND is the ground voltage. In the data-writing mode, the control gate of any memory cell selected is applied with a voltage during the period T1 and with a different voltage during the period T2.

Figures 1, 2:
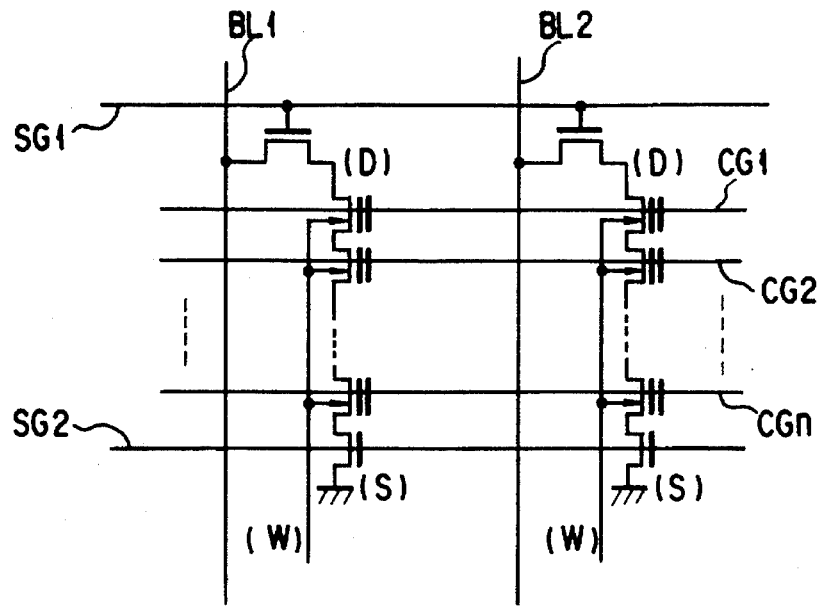
FIG. 1 is a circuit diagram showing a part of a conventional NAND-type flash EEPROM.
FIG. 2 is a table showing the various voltages applied at various points in the EEPROM of FIG. 1 to erase data in, write data into and read data from the EEPROM.

Data is erased in, and read from, the NAND-type flash EEPROM in the same way as in the conventional NAND-type flash EEPROM shown in FIG. 1.

How to write data into the EEPROM will be explained below in detail, with reference to FIGS. 5 to 8 which are sectional views of some of the memory cells of the EEPROM. Here, it is assumed that all memory cells have already been set into a normally-on state, each storing data "1," and that the word lines CGn, . . . CG2 and CG1 are sequentially driven in the order mentioned. Further assume that "0" is written into the memory cell MC1 and "1" is stored in the memory cell MC2 when the control gate CG2 is driven.

First, all word lines CG1 to CGn and the bit line BL2 not selected (writing "1") are set at Vcc (5 V) for a predetermined period T1. During the period T1, the bit line BL1 selected and the select gate SG2 are set at the ground voltage GND (0 V), and the select gate SG1 is set at the low voltage $V_L$. Then, as shown in FIG. 5, the diffusion layers and the channel regions, which are closer to the memory cell MC2 than the select gate SG1 located under the bit line BL2, are charged to $V_L$ (3 V)–Vth (2 V)=1 V, where Vth is the threshold voltage of the select transistor having the select gate SG1. At this time, the memory cell is applied with 5 V from the word line CG1 which is positioned closer to the select gate SG1 than the word line CG2. Therefore, the memory cell having the CG1 has its threshold voltage at a negative value and therefore remains in data-erased state. Hence, the memory cell having the CG1 functions as a transfer gate without voltage drop.

Figure 6:
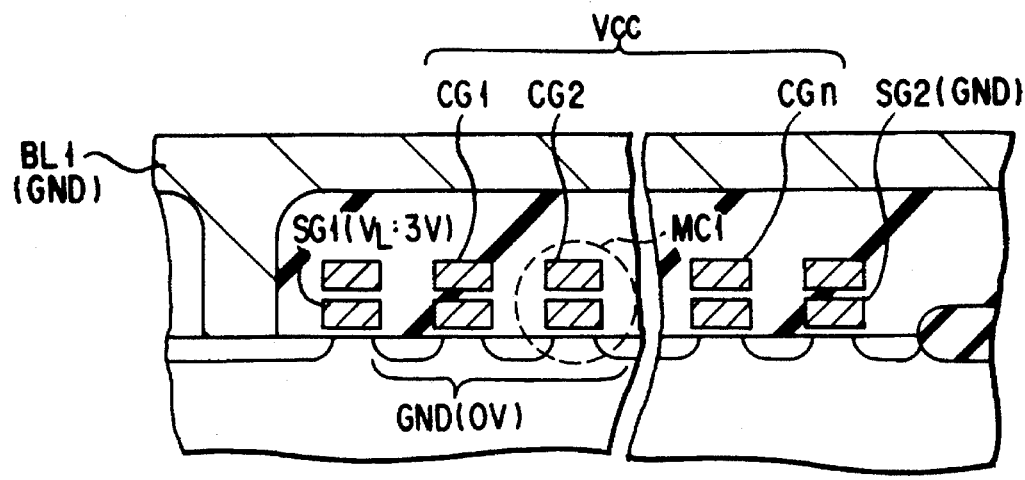

In the meantime, as shown in FIG. 6, the diffusion layers and channel regions, which are closer to the memory cell MC1 than the select gate SG1 located under the bit line BL1, that is, the channel region of the memory cell MC1, is charged to 0 V. This is because the select transistor having the select gate SG1 and the memory cell having the word line CG1 functions as a transfer gate without voltage drop.

Figure 7:
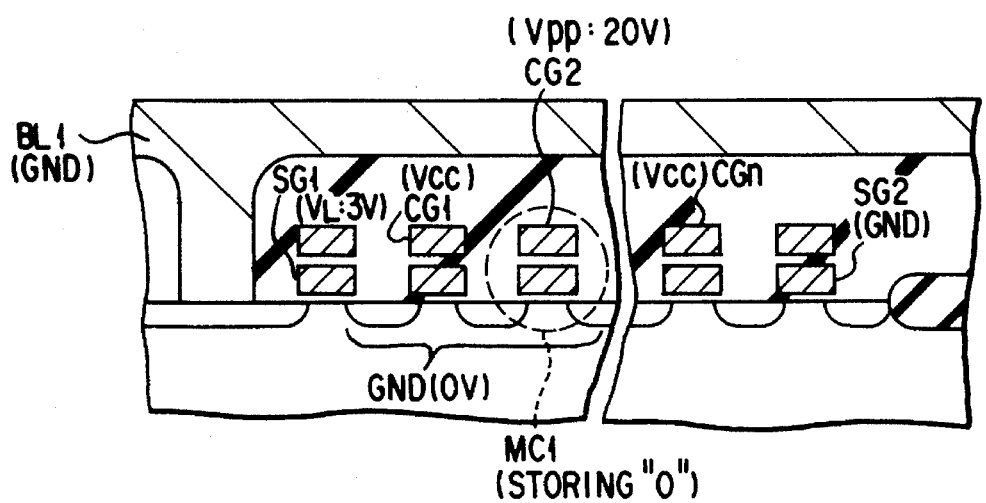

During a predetermined period T2 which follows the period T1, the word line CG2 is set at the high voltage Vpp of 20 V to write data. As shown in FIG. 7, the select transistor and the memory cell, both controlled by the select gates SG1 and the word line CG1 and located under the bit line BL1, are conducting, and the channel region of the memory cell MC1 is fixed at 0 V. Electrons are therefore injected into the floating gate of the memory cell MC1. Data "0" is thereby written into the memory cell MC1.

Figure 8:
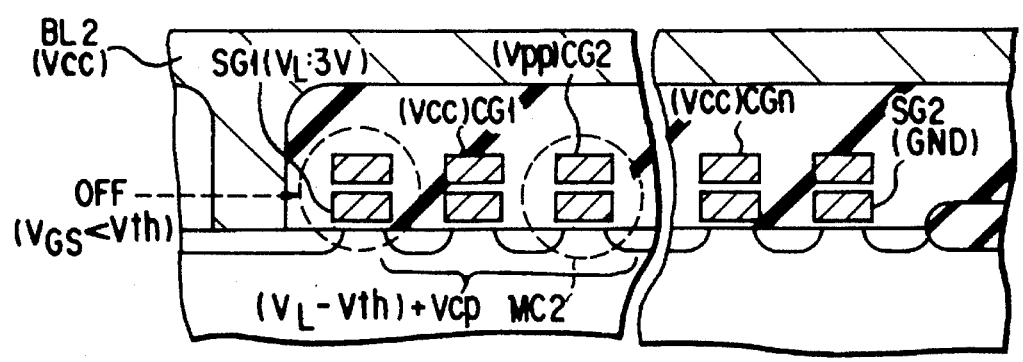

As shown in FIG. 8, the diffusion layers and the channel regions, which are located under the bit line BL2 not selected, are set to a voltage of 1 V+Vcp, where Vcp is a voltage derived from the voltage Vpp (20 V) applied on the word line CG2 due to capacitive coupling. The select transistor located beneath the bit line BL2 and controlled by the select gate SG1 has its gate-source voltage $V_{GS}$ held below its threshold voltage Vth and is cut off. As a result, no current is supplied to the select transistor, and the potential of the channel region of the memory cell MC2 rises further. Data-writing into the memory cell MC2 is thereby inhibited.

Figures 9, 10:
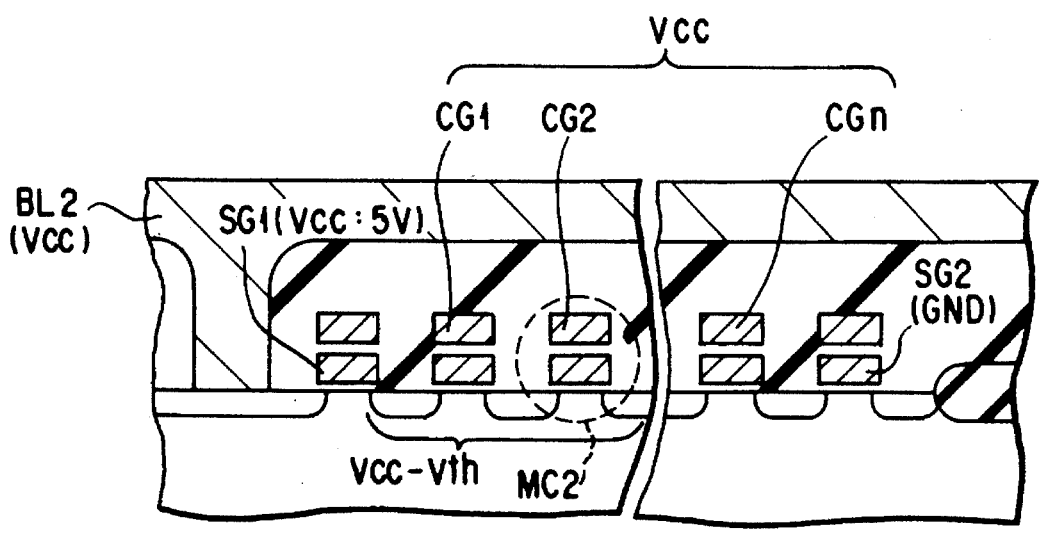
FIG. 9 is a table showing the various voltages applied at various points in a NAND-type flash EEPROM of FIG. 3 which is the second embodiment of this invention.
FIGS. 10 to 13 are sectional views of some of the memory cells of the EEPROM which is the second embodiment of the invention.

FIG. 9 is a table which shows the various voltages applied at various points in a NAND-type flash EEPROM which is the second embodiment of this invention. This EEPROM differs from the EEPROM (FIG. 3) according to the first embodiment in that the select gate SG1 is maintained at the power-supply voltage Vcc (5 V) during the period T1. Data is erased in, and read from, this NAND-type flash EEPROM, exactly in the same manner as in the first embodiment.

How to write data into the EEPROM will be explained below in detail, with reference to FIGS. 10 to 13 which are sectional views of some of the memory cells of the EEPROM. Here, it is assumed that data has already been erased in all memory cells, and that the word lines CGn, . . . CG2 and CG1 are sequentially driven in the order mentioned. It is also assumed that "0" is written into the memory cell MC1 and "1" is stored in the memory cell MC2 when the control gate CG2 is driven.

First, during the period T1, all word lines CG1 to CGn and the bit line BL2 not selected (writing "1") are set at Vcc (5 V). The diffusion layers and the channel regions, which are closer to the memory cell MC2 than the select gate SG1 located under the bit line BL2, are charged to Vcc (5 V)–Vth (2 V)=3 V as shown in FIG. 10, where Vth is the threshold voltage of the select transistor having the select gate SG1. At this time, the memory cell is applied with 5 V from the word line CG1 which is positioned closer to the select gate SG1 than the word line CG2. Therefore, the memory cell having the CG1 has its threshold voltage at a negative value and therefore remains in data-erased state. Hence, the memory cell having the CG1 functions as a transfer gate without voltage drop.

Figure 11:
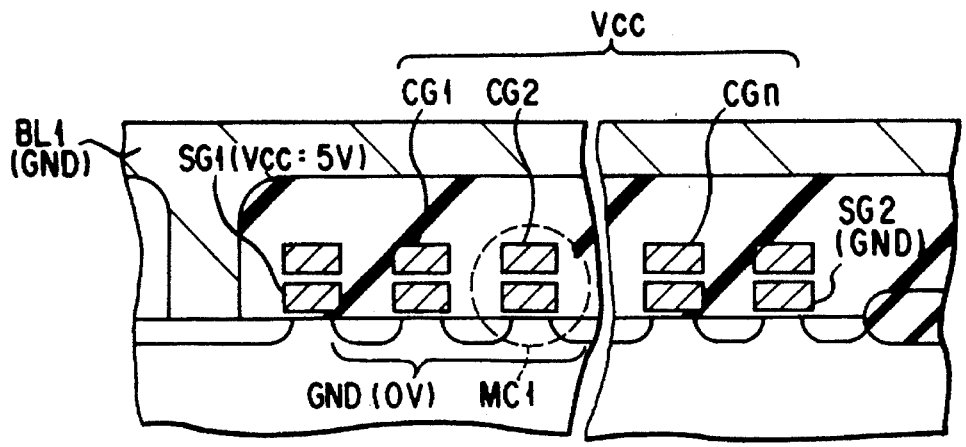

In the meantime, as shown in FIG. 11, the diffusion layers and channel regions, which are closer to the memory cell MC1 than the select gate SG1 located under the bit line BL1, that is, the channel region of the memory cell MC1, is charged to 0 V. This is because the select transistor having the select gate SG1 and the memory cell having the word line CG1 functions as a transfer gate without voltage drop.

Figure 12:
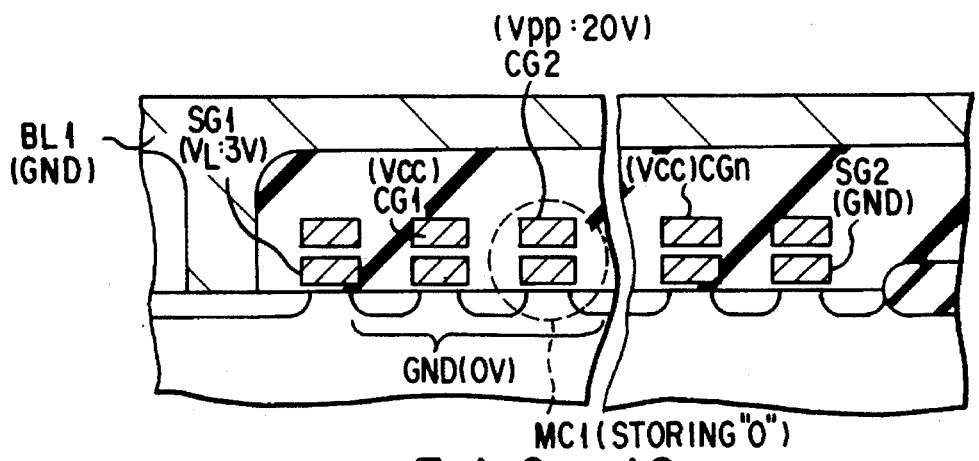

During a predetermined period T2 which follows the period T1, the word line CG2 is set at the high voltage Vpp of 20 V to write data. At the same time, the voltage of the select gate SG1 is reduced from 5 V to 3 V. As shown in FIG. 12, the select transistor and the memory cell, both controlled by the select gate SG1 and the word line CG1 and located under the bit line BL1, are conducting, and the channel region of the memory cell MC1 is fixed at 0 V. Electrons are therefore injected into the floating gate of the memory cell MC1. Data "0" is thereby written into the memory cell MC1.

Figure 13:
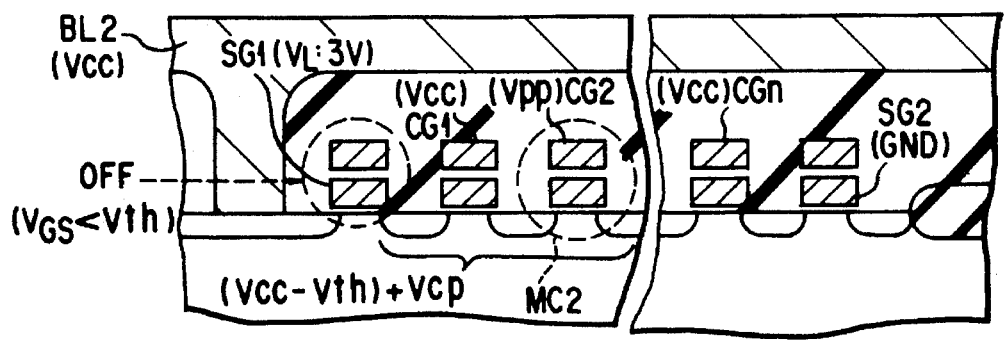

As shown in FIG. 13, the select transistor located beneath the bit line BL2 and controlled by the word line CG1 has its gate-source voltage $V_{GS}$ reduced to 0 V since its gate voltage has been reduced from 5 V to 3 V. The select transistor is therefore cut off. A current is no longer supplied from the bit line BL2. As a result, the potential of the channel region of the memory cell MC2 is raised above the initial charged value (3 V) due to the voltage Vpp (20 V) applied on the word line CG2 which is capacitance-coupled between the control gate CG2 and the floating gate of the memory cell MC2 and between the floating gate and the source, drain and channel regions of the memory cell MC2. Data-writing into the memory cell MC2 is thereby inhibited.

In the second embodiment, the node of the select transistor and the memory cell not selected is initially charged to a higher voltage than in the first embodiment. The data-writing into the memory cell not selected can therefore be inhibited more readily.

Figure 14:
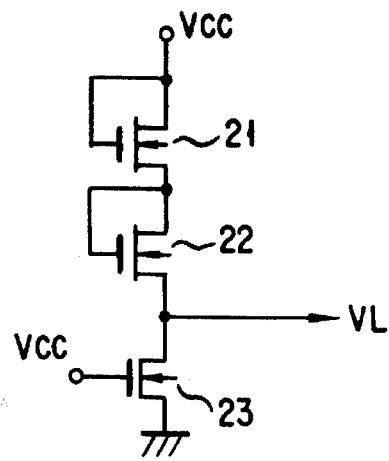
FIG. 14 is a circuit diagram of the low-voltage controller incorporated in the NAND-type flash EEPROM shown in FIG. 3.

FIG. 14 is a circuit diagram of the low-voltage controller 16 incorporated in the NAND-type flash EEPROM of FIG.

3. As shown in FIG. 14, the controller 16 comprises two NMOS FETs 21 and 22 connected in series, and a smaller NMOS FET 23 connected to the NMOS FET 22. The voltage $V_L$, which is lower than the threshold voltage of NMOS FETs 21 and 22, is applied from the node of the NMOS FETs 22 and 23.

Figure 15:
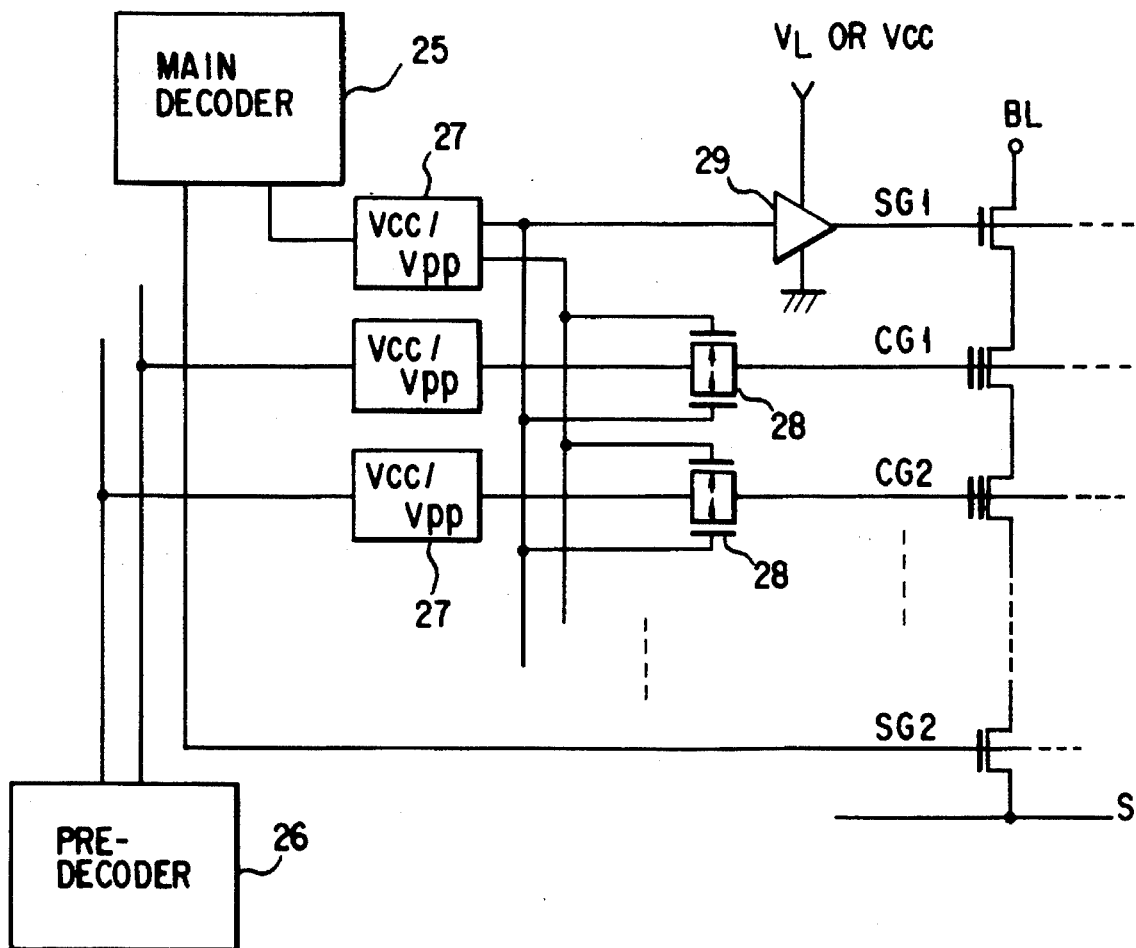
FIG. 15 is a diagram showing a circuit incorporated in the EEPROM of FIG. 3.

FIG. 15 is a diagram showing the circuit incorporated in the EEPROM, for applying the low voltage to the select gates via the row decoder 14. This circuit comprises a main decoder 25, a pre-decoder 26, level shifters 27, transfer switches 28, and a buffer 29. In operation, the main decoder 25 controls the select gates SG1 and SG2, and the pre-decoder 26 controls the control gates CG1, CG2, ... CGn. Either the voltage Vcc (5 V) or the low voltage $V_L$ (3 V) is applied to the select gate SG1 through the buffer 29.

FIG. 16 is a circuit diagram showing the voltage-boosting circuit 15. The circuit 15 is designed to generate the voltage Vpp (20 V) from the power-supply voltage Vcc (5 V). As shown in FIG. 16, the circuit 15 comprises a plurality of MOSFETs 31 connected in series, each having its drain and its gate connected together. Of any two adjacent MOSFETs 31, the drain-gate node of one is connected by a capacitor C to one of two lines for supplying two voltage-boosting clock signals $\phi$ and $\phi B$ (i.e., complementary signals), and the drain-gate node of the other is connected by a capacitor C to the other of the two lines for supplying two voltage-boosting clock signals $\phi$ and $\phi B$. Another circuit similar to this circuit 15 is not necessary as in the conventional NAND-type flash EEPROM (FIG. 1) for generating an intermediate voltage Vm (10 V).

In the present invention, the bit lines are set at the power-supply voltage Vcc (5 V) at all times, and an intermediate voltage Vm (10 V) need not be applied at all. Hence, to operate the data latch/sense amplifier 11 (FIG. 3), it suffices to apply the power-supply voltage Vcc to the flip-flop circuit FF which is incorporated in the data latch/sense amplifier 11 as shown in FIG. 17. The data latch/sense amplifier 11 has a verify function of a forcibly inverted type. In this example, explanation will be given of only a single bit line for easy understanding.

As is shown in FIG. 17, the data latch/sense amplifier 11 for a single bit line is constructed as follows: A plurality of NAND type memory cells as shown in FIG. 3 are connected to bit line BL. A P-channel transistor Q1 is provided for charging the bit line BL. A flip-flop circuit FF for temporarily storing writing data has a node N and a node BN. An N-channel transistor Q2 is interposed between the node N of the flip-flop circuit FF and the bit line BL for electrically connecting or disconnecting them. N-channel transistors Q3 and Q4 are connected in series between the node BN of the flip-flop circuit FF and a ground potential of 0 V. The gate of the transistor Q3 is connected to the bit line BL. The transistors Q3 and Q4 constitute forcibly inverting means (data setting circuit). An N-channel transistor Q5 having a reset function is interposed between the node N and the ground potential of 0 V. The node BN of the flip-flop circuit FF is connected to an I/O line 5 via a column gate 4.

A signal line $\phi 1$ is connected to the gate of transistor Q1, and a signal line $\phi 2$ is connected to the gate of transistor Q2, and a signal line $\phi 3$ is connected to the gate of transistor Q4. A signal line $\phi R$ is connected to the gate of the resetting transistor Q5.

The operation of the data latch/sense amplifier 11 constructed as above will be explained. Before reading the bit line potential, the transistor Q5 is turned on by the clock signal $\phi R$, to thereby initialize the flip-flop circuit FF (i.e., to set the node N to "L" level). Then, the bit line BL is precharged with the clock signal $\phi 1$. The transistor Q2 is turned on by the clock signal $\phi 2$, causing the bit line to be in a free running state. After a predetermined time period elapses, the transistor Q4 is turned on by the clock signal $\phi 3$. If the bit line has a potential of "L" level, the flip-flop circuit FF is kept in the initial state, whereas if the bit line has a potential of "H" level, the state of the flip-flop circuit is inverted, resetting the level of the node BN from "H" to "L".

A verification using the data latch/sense amplifier 11 will be described briefly for two cases (i) and (ii).

(i) In the case where the node N is set to "L" and an operation of writing data "0" in the selected cell is performed, when a given time (free running period) elapses after the precharging of the bit line BL caused by turning the transistor Q2 off and the transistor Q1 on in the reading operation at the next verification, the following cell states are possible.

(1) The cell which has surely obtained threshold value as data "0" holds the precharged potential of the bit line.

(2) The cell whose threshold voltage has not yet been set sufficiently or the cell in which the necessary amount of electrons has not been injected is close to the ON state and discharges the precharged potential of the bit line.

The verifying operation is conducted as follows. First, in the write condition of (i), there are also two possible states (1) and (2). Then, the transistor Q4 is turned on. If the cell state is the state (1), the latched data of the flip-flop circuit FF is inverted and the selected cell connected to this bit line is eliminated from the next rewriting. This is because the node N in the next rewriting is at the level "H" and the write disable voltage is applied to the bit line. In the state (2), the transistor Q3 is not turned on and the node N remains at the "L" level, so that the next rewriting is performed. This rewriting operation is repeated until the state (1) is obtained at the time of verification. Under the writing condition (ii), the bit line inevitably becomes a discharged state, so that the transistor Q3 is not turned on and the node N remains at the "H" level. In the next rewriting operation, therefore, the write disable voltage (5 V) is applied to the bit line in the next rewriting mode as done the first time. That is, no data is written in the bit line connected to the node N of the flip-flop circuit FF which has the level "H."

Figure 18:
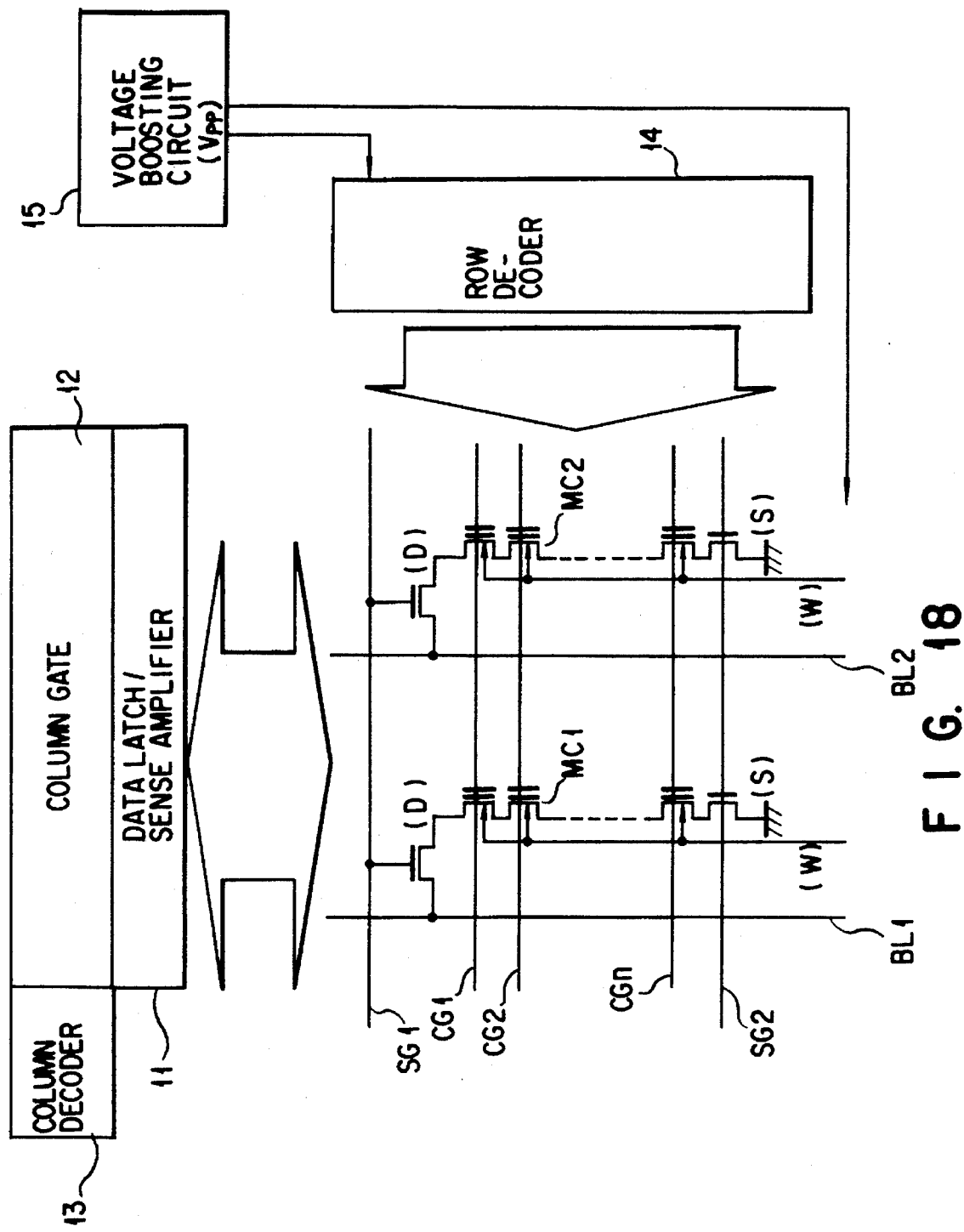
FIG. 18 is a block diagram illustrating the major components of a NAND-type flash EEPROM which is the third embodiment of the present invention.

FIG. 18 is a block diagram illustrating the major components of a NAND-type flash EEPROM which is the third embodiment of the invention. This NAND-type flash EEPROM differs from the first embodiment (FIG. 3), only in that no component corresponding to the low-voltage controller 16 is provided. It has a voltage-boosting circuit 15 which is designed to generate only the high voltage Vpp (20 V) as its counterpart of the first embodiment (FIG. 3).

Figures 19, 20:
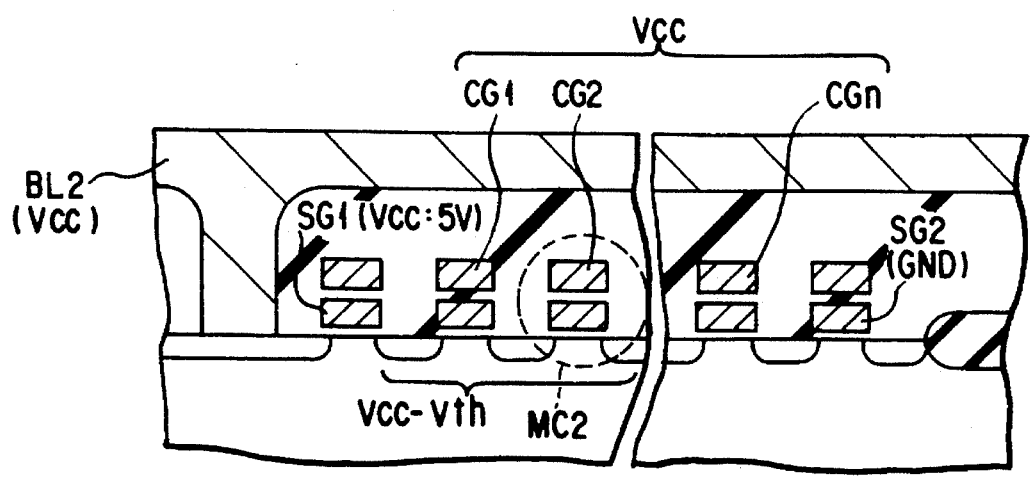

FIG. 19 is a table showing the various voltages applied at various points in the EEPROM of FIG. 18 to drive the memory cells incorporated in this EEPROM. Vcc is the power-supply voltage of, for example, 5 V. Vpp is a high voltage of, for example, 20 V and used for erasing and writing data. GND is the ground voltage. In the data-writing mode, any memory cell selected is applied with a voltage during the period T1 and with a different voltage during the period T2. The select gate SG1 is set the power-supply voltage at all the time.

Data is erased in, and read from, the NAND-type flash EEPROM in the same way as in the conventional NAND-type flash EEPROM shown in FIG. 1.

How to write data into the EEPROM (FIG. 18) will be explained below in detail, with reference to FIGS. 20 to 23 which are sectional views of some of the memory cells of the EEPROM. Here, it is assumed that data has already been erased in all memory cells, and that the word lines CGn, . . . CG2 and CG1 are sequentially driven in the order mentioned, as in the case of the first and second embodiments. It is also assumed that "0" is written into the memory cell MC1 and "1" is stored in the memory cell MC2 when the control gate CG2 is driven, also as in the first and second embodiments.

First, all word lines CG1 to CGn and the bit line BL2 not selected (writing "1") are set at Vcc (5 V) for a predetermined period T1. During the period T1, the bit line BL1 selected and the select gate SG2 are set at the ground voltage GND (0 V). Then, as shown in FIG. 20, the diffusion layers and the channel regions, which are closer to the memory cell MC2 than the select gate SG1 located under the bit line BL2, are charged to Vcc (5 V)–Vth (2 V)=3 V, where Vth is the threshold voltage of the select transistor having the select gate SG1.

Any memory cell closer to the select gate SG1 than the memory cell into which data is been written remains in a data-erased state since data has not yet to be written into it. The memory cell therefore functions as a transfer gate without voltage drop. Hence, the drain of the memory cell into which to write data "1" is set at 3 V which is the difference between the voltage (5 V) applied to the bit line to which the memory cell is connected and the threshold voltage (2 V) of the select transistor turned on by the voltage (5 V) applied to the select gate SG1. In the meantime, as shown in FIG. 21, the drain of the memory cell into which to write "0" is set at 0 V, i.e., the voltage on the bit line to which this memory cell is connected (FIG. 21).

During a predetermined period T2 which follows the period T1, the word line CG2 is set at the high voltage Vpp of 20 V to write data. As shown in FIG. 22, the select transistor and the memory cell, both controlled by the select gates SG1 and the word line CG1 located under the bit line BL1, are conducting, and the channel region of the memory cell MC1 is fixed at 0 V. Electrons are therefore injected into the floating gate of the memory cell MC1. Data "0" is thereby written into the memory cell MC1.

As shown in FIG. 23, the diffusion layers and the channel regions, which are located under the bit line BL2 not selected, are set to a voltage of 3 V (initial charged value)+ Vcp, where Vcp is a voltage derived, due to capacitive coupling, from the voltage Vpp (20 V) applied on the word line CG2. The select transistor located beneath the bit line BL2 and controlled by the select gate SG1 has its gate-source voltage $V_{GS}$ held below its threshold voltage Vth and is cut off. As a result, no current is supplied to the select transistor, and the potential of the channel region of the memory cell MC2 rises further. Data-writing into the memory cell MC2 is thereby inhibited.

Figure 24:
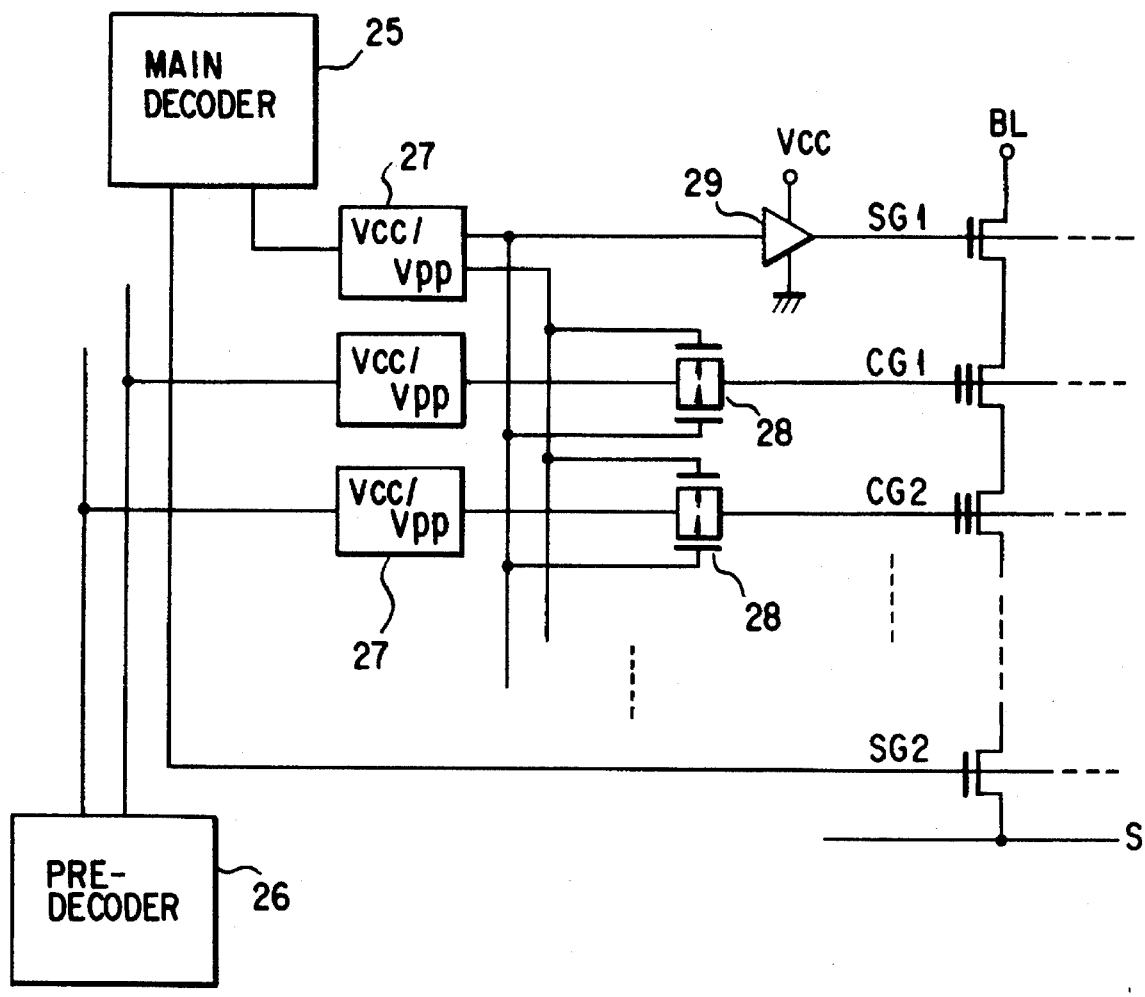
FIG. 24 is a circuit diagram showing, in detail, a section of the EEPROM illustrated in FIG. 18.

FIG. 24 is a circuit diagram showing the circuit incorporated in the EEPROM, for applying the Vcc voltage to the select gates via the row decoder 14 shown in FIG. 18. This circuit comprises a main decoder 25, a pre-decoder 26, level shifters 27, transfer switches 28, and a buffer 29. In operation, the main decoder 25 controls the select gates SG1 and SG2, and the predecoder 26 controls the control gates CG1, CG2, . . . CGn. Since no low-voltage controller is provided, only the voltage Vcc (5 V) is applied to the select gate SG1 through the buffer 29. Obviously, the EEPROM according to the third embodiment comprises less components than the first embodiment (FIG. 3).

The present invention is not limited to the embodiments described above. Rather, it may be applied to a semiconductor memory device wherein some memory cells are not connected in series to form a unit, and each memory cell has its drain connected to a select transistor and its source connected to an element having a voltage-switching means.

As has been described, the present invention can provide a nonvolatile semiconductor memory device in which a high control voltage (i.e., a voltage Vm intermediate between 0 V and a write voltage Vpp) need not be applied to the select gates in order to prohibit data-writing. Hence, it is unnecessary to form two gate oxide films in the memory cell array, one for the cell transistors and the other for select transistors which receive the intermediate voltage Vm. In other words, the gate oxide films having substantially the same thickness are formed between the gate electrode of the select transistor and the semiconductor substrate and between the floating gate of the cell transistor and the semiconductor substrate. The memory cell array therefore occupies a smaller area, and the gate oxide film for the cell transistors is more reliable, than in the case two gate oxide films are formed in the memory cell array. Moreover, no circuit peripheral to the memory cell array needs to incorporate MOSFETs driven by an intermediate voltage. This serves to reduce the chip size of the nonvolatile semiconductor memory device.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrically erasable programmable nonvolatile memory device comprising:

a semiconductor substrate;

a memory cell unit, including a plurality of memory cells arranged in series, a first end memory cell having a source region and a second end memory cell having a drain region, said source and drain regions both formed in a surface of said semiconductor substrate, a transistor having a charge-accumulating layer provided on the surface of said semiconductor substrate, said transistor located between said source and drain regions, and a control gate electrode provided on said charge-accumulating layer of said transistor;

a select transistor having a gate electrode and a terminal coupled to said drain region of said second end memory cell and having a threshold voltage;

a bit line to which said drain region of said second end memory cell is connected by a current path of said select transistor including said gate electrode and said terminal of said select transistor;

charging means for applying, during a first data-writing period when said bit line is not selected, a first voltage to said control gate electrode and said bit line, and a second voltage to said gate electrode of said select transistor to turn on said select transistor, thereby to charge said drain region to a third voltage lower than the second voltage by the threshold voltage of said select transistor;

control-gate voltage switching means for increasing voltages of said source and drain regions and a voltage of a channel region provided between said source and drain regions, thereby to increase the third voltage, by capacitive coupling which occurs between said control gate electrode and said charge-accumulating layer and between said charge-accumulating layer and said source, drain and channel regions when a data-writing high voltage is applied to said control gate during a second data-writing period; and data-write prohibiting means for turning off said select transistor to cut off the current path of said memory cell unit when a source-gate voltage of said select transistor falls below the threshold voltage of said select transistor due to the capacitive coupling.

2. The device according to claim 1, wherein the first voltage is substantially equal to a power-supply voltage externally applied to said device.

3. The device according to claim 1, wherein the second voltage is lower than the first voltage and higher than the threshold voltage of said select transistor.

4. The device according to claim 1, wherein the second voltage is higher than the threshold voltage of said select transistor and is substantially equal to the first voltage.

5. The device according to claim 1, further comprising voltage-switching means for applying a fourth voltage to said gate electrode of said select transistor during the second data writing period, the fourth voltage being lower than the second voltage and higher than the threshold voltage of said select transistor.

6. The device according to claim 5, wherein the first voltage and the second voltage are substantially equal to a power-supply voltage externally applied to said device.

7. An electrically erasable programmable non-volatile memory device comprising:

a semiconductor substrate;

a memory cell unit, including a plurality of memory cells arranged in series, a first end memory cell having a source region and a second end memory cell having a drain region, said source and drain regions both formed in a surface of said semiconductor substrate,
    a transistor having a charge-accumulating layer provided on the surface of said semiconductor substrate, said transistor located between said source and drain regions, and
    a control gate electrode provided on said charge-accumulating layer of said transistor;

a select transistor having a gate electrode and a terminal coupled to said drain region of said second end memory cell and having a threshold voltage;

a bit line to which said drain region of said second end memory cell is connected by a current path of said select transistor including said gate electrode and said terminal of said select transistor;

a bit-line charging means for applying, during a data writing period when said bit line is not selected, a first voltage to said bit line, the first voltage being relatively low and higher than the threshold voltage of said select transistor;

a gate-voltage applying means for applying, during the data writing period, a second voltage to said gate electrode of said select transistor, the second voltage being higher than the threshold voltage of said select transistor and not exceeding the first voltage; and control-gate voltage switching means for applying a third voltage to said source and drain regions when said memory cell unit is selected, for a predetermined time during the data-writing period, and for applying a high voltage to said control gate after lapse of the predetermined period, the third voltage being lower than the second voltage by at least the threshold voltage of said select transistor.

8. The device according to claim 7, wherein the first voltage is substantially equal to a power-supply voltage externally applied to said device and the third voltage is substantially equal to a ground potential of said device.

9. The device according to claim 7, wherein the first voltage and the second voltage are substantially equal.

10. The device according to claim 7, further comprising voltage-switching means for lowering the second voltage after the lapse of the predetermined time during the data-writing period.

11. The device according to claim 7, wherein gate insulating films having substantially the same thickness are formed between said gate electrode of said select transistor and said semiconductor substrate and between said charge-accumulating layer of said memory cell unit and said semiconductor substrate.

12. An electrically erasable programmable nonvolatile memory device comprising:

a semiconductor substrate;

a memory cell unit, including a plurality of memory cells arranged in series, a first end memory cell having a source region and a second end memory cell having a drain region, said source and drain regions both formed in a surface of said semiconductor substrate,
    a transistor having a charge-accumulating layer provided on the surface of said semiconductor substrate, said transistor located between said source and drain regions, and
    a control gate electrode provided on said charge-accumulating layer of said transistor;

a select transistor having a gate electrode and a terminal coupled to said drain region of said second end memory cell and having a threshold voltage;

a bit line to which said drain region of said second end memory cell is connected by a current path of said select transistor including said gate electrode and said terminal of said select transistor;

charging means for applying, during a first data-writing period when said bit line is not selected, a first voltage to said control gate electrode and said bit line, and a second voltage to said gate electrode of said select transistor to turn on said select transistor, thereby to charge said drain region to a third voltage lower than the second voltage by the threshold voltage of said select transistor;

control-gate voltage switching means for increasing voltages of said source and drain regions and a voltage of a channel region provided between said source and drain regions, thereby to increase the third voltage, by capacitive coupling which occurs between said control gate electrode and said charge-accumulating layer and between said charge-accumulating layer and said source, drain and channel regions when a data-writing high voltage is applied to said control gate during a second data-writing period; and data-write prohibiting means for turning off said select transistor to cut off the current path of said memory cell unit when a source-gate voltage of said select transistor falls below the threshold voltage of said select transistor due to the capacitive coupling; and verify means for correcting the threshold voltage, the threshold voltage relating to data writing.

13. The device according to claim 12, wherein the first voltage is substantially equal to a power-supply voltage externally applied to said device.

14. The device according to claim 12, wherein the second voltage is lower than the first voltage and higher than the threshold voltage of said select transistor.

15. The device according to claim 12, wherein the second voltage is higher than the threshold voltage of said select transistor and is substantially equal to the first voltage.

16. The device according to claim 12, further comprising voltage-switching means for applying a fourth voltage to said gate electrode of said select transistor during the second data-writing period, the fourth voltage being lower than the second voltage and higher than the threshold voltage of said select transistor.

17. The device according to claim 12, wherein the first voltage and the second voltage are substantially equal to a power-supply voltage externally applied to said device.

18. An electrically erasable programmable non-volatile memory device comprising:
   a semiconductor substrate;
   a memory cell unit, including
   a plurality of memory cells arranged in series, a first end memory cell having a source region and a second end memory cell having a drain region, said source and drain regions both formed in a surface of said semiconductor substrate,
      a transistor having a charge-accumulating layer provided on the surface of said semiconductor substrate, said transistor located between said source and drain regions, and
      a control gate electrode provided on said charge-accumulating layer of said transistor;
   a select transistor having a gate electrode and a terminal coupled to said drain region of said second end memory cell and having a threshold voltage;
   a bit line to which said drain region of said second end memory cell is connected by a current path of said select transistor including said gate electrode and said terminal of said select transistor;
   a bit-line charging means for applying, during a data writing period when said bit line is not selected, a first voltage to said bit line, the first voltage being relatively low and higher than the threshold voltage of said select transistor;
   a gate-voltage applying means for applying, during the data writing period, a second voltage to said gate electrode of said select transistor, the second voltage being higher than the threshold voltage of said select transistor and not exceeding the first voltage; and
   control-gate voltage switching means for applying a third voltage to said source and drain regions when said memory cell unit is selected, for a predetermined time during the data-writing period, and for applying a high voltage to said control gate after lapse of the predetermined period, the third voltage being lower than the second voltage by at least the threshold voltage of said select transistor; and
   verify means for correcting the threshold voltage, the threshold voltage relating to data writing.

19. The device according to claim 18, wherein the first voltage is substantially equal to a power-supply voltage externally applied to said device and the third voltage is substantially equal to a ground potential of said device.

20. The device according to claim 18, wherein the first voltage and the second voltage are substantially equal.

21. The device according to claim 18, further comprising voltage-switching means for lowering the second voltage after the lapse of the predetermined time during the data-writing period.

22. The device according to claim 18, wherein said verify means comprises:
   a flip-flop circuit for determining whether data read from or written into said memory cell unit is in a first state or a second state and holding the determined data in a predetermined holding node;
   precharge means for precharging said bit line in a verify mode for said memory cell unit;
   connecting means for connecting said flip-flop circuit to said bit line, said connecting means electrically disconnecting, for a predetermined time period, said bit line from said flip-flop circuit in the verify mode;
   a first verifying transistor conductive in the verify mode, and a second verifying transistor having a gate controlled in response to a signal from said bit line; and
   circuit means for forming a current path which allows said first and second transistors to invert dam held by the predetermined holding node of said flip-flop circuit at a termination time of the verify mode.

23. The device according to claim 22, wherein said flip-flop circuit includes reset means.

24. The device according to claim 2, wherein the second voltage is lower than the first voltage and higher than the threshold voltage of said select transistor.

25. The device according to claim 2, wherein the second voltage is higher than the threshold voltage of said select transistor and is substantially equal to the first voltage.

26. The device according to claim 1, wherein gate insulating films having substantially the same thickness are formed between said gate electrode of said select transistor and said semiconductor substrate and between said charge-accumulating layer of said memory cell unit and said semiconductor substrate.

27. The device according to claim 8, wherein the first voltage and the second voltage are substantially equal.

28. The device according to claim 12, wherein said verify means comprises:
   a flip-flop circuit for determining whether data read from or written into said memory cell unit is in a first state or a second state and holding the determined data in a predetermined holding node;
   precharge means for precharging said bit line in a verify mode for said memory cell unit;
   connecting means for connecting said flip-flop circuit to said bit line, said connecting means electrically disconnecting, for a predetermined time period, said bit line from said flip-flop circuit in the verify mode;
   a first verifying transistor conductive in the verify mode, and a second verifying transistor having a gate controlled in response to a signal from said bit line; and
   circuit means for forming a current path which allows said first and second transistors to invert data held by the predetermined holding node of said flip-flop circuit at a termination time of the verify mode.

29. The device according to claim 13, wherein the second voltage is lower than the first voltage and higher than the threshold voltage of said select transistor.

30. The device according to claim 13, wherein the second voltage is higher than the threshold voltage of said select transistor and is substantially equal to the first voltage.

31. The device according to claim 19, wherein the first voltage and the second voltage are substantially equal.

* * * * *